United States Patent
Manohar et al.

(10) Patent No.: US 8,125,242 B2
(45) Date of Patent: Feb. 28, 2012

(54) RECONFIGURABLE LOGIC FABRICS FOR INTEGRATED CIRCUITS AND SYSTEMS AND METHODS FOR CONFIGURING RECONFIGURABLE LOGIC FABRICS

(75) Inventors: Rajit Manohar, Ithaca, NY (US); Clinton W. Kelly, Ithaca, NY (US)

(73) Assignee: Achronix Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/007,933

(22) Filed: Jan. 17, 2011

(65) Prior Publication Data

US 2011/0169524 A1     Jul. 14, 2011

Related U.S. Application Data

(63) Continuation of application No. 12/304,694, filed as application No. PCT/US2007/072300 on Jun. 27, 2007, now Pat. No. 7,880,499.

(60) Provisional application No. 60/817,552, filed on Jun. 28, 2006.

(51) Int. Cl.
*H03K 19/177* (2006.01)
(52) U.S. Cl. .............. 326/39; 326/38; 326/41
(58) Field of Classification Search ............. 326/38–41, 326/93
See application file for complete search history.

(56) References Cited

U.S. PATENT DOCUMENTS

| | | |
|---|---|---|
| 4,756,010 A | 7/1988 | Nelson et al. |
| 5,245,605 A | 9/1993 | Ofek |
| 5,367,209 A | 11/1994 | Hauck et al. |
| 5,724,276 A | 3/1998 | Rose et al. |
| 5,834,957 A | 11/1998 | Staton |
| 5,926,036 A | 7/1999 | Cliff et al. |
| 5,943,288 A * | 8/1999 | Jiang ................. 365/230.06 |
| 6,075,830 A | 6/2000 | Piirainen |
| 6,111,814 A | 8/2000 | Schaefer |
| 6,292,496 B1 | 9/2001 | Rasanen |
| 6,359,468 B1 | 3/2002 | Park et al. |
| 6,557,161 B2 | 4/2003 | Jones |
| 6,611,469 B2 * | 8/2003 | Williams et al. ............ 365/221 |
| 6,762,630 B2 * | 7/2004 | Fibranz et al. ............. 327/141 |
| 6,848,060 B2 | 1/2005 | Cook et al. |
| 6,912,860 B2 | 7/2005 | Zima et al. |
| 6,934,816 B2 * | 8/2005 | Matthews et al. ............ 711/149 |
| 6,950,959 B2 | 9/2005 | Davies et al. |
| 6,961,741 B2 | 11/2005 | Swami |
| 6,961,863 B2 | 11/2005 | Davies et al. |
| 7,157,934 B2 | 1/2007 | Teifel et al. |

(Continued)

FOREIGN PATENT DOCUMENTS

WO    WO-2008008629 A2    1/2008

(Continued)

OTHER PUBLICATIONS

"Korean Application Serial No. 10-2008-7031271,Final Office Action mailed Mar. 11, 2011", with English translation of Office Action Summary, 5 pgs.

(Continued)

*Primary Examiner* — Vibol Tan
(74) *Attorney, Agent, or Firm* — Schwegman, Lundberg & Woessner, P.A.

(57) ABSTRACT

In accordance with the present invention there are provided herein asynchronous reconfigurable logic fabrics for integrated circuits and methods for designing asynchronous circuits to be implemented in the asynchronous reconfigurable logic fabrics.

20 Claims, 9 Drawing Sheets

U.S. PATENT DOCUMENTS

| | | | |
|---|---|---|---|
| 7,301,824 B1 * | 11/2007 | New | 365/189.011 |
| 7,395,450 B2 | 7/2008 | Karaki | |
| 7,454,589 B2 | 11/2008 | Taniguchi et al. | |
| 7,688,671 B2 | 3/2010 | Hosoe et al. | |
| 7,733,123 B1 | 6/2010 | Young et al. | |
| 7,739,628 B2 | 6/2010 | Manohar et al. | |
| 7,765,382 B2 | 7/2010 | Chester | |
| 7,880,499 B2 | 2/2011 | Manohar et al. | |
| 7,900,078 B1 | 3/2011 | Manohar et al. | |
| 2002/0116426 A1 | 8/2002 | Swami | |
| 2005/0077918 A1 | 4/2005 | Teifel et al. | |
| 2010/0013517 A1 | 1/2010 | Manohar et al. | |
| 2010/0102848 A1 | 4/2010 | Gershenfeld et al. | |
| 2010/0185837 A1 | 7/2010 | Dalrymple et al. | |
| 2010/0303067 A1 | 12/2010 | Manohar et al. | |
| 2011/0058570 A1 | 3/2011 | Ekanayake et al. | |
| 2011/0062987 A1 | 3/2011 | Manohar et al. | |
| 2011/0130171 A1 | 6/2011 | Manohar et al. | |

FOREIGN PATENT DOCUMENTS

| | | | |
|---|---|---|---|
| WO | WO-2008008629 A3 | 1/2008 | |
| WO | WO-2008008629 A4 | 1/2008 | |

OTHER PUBLICATIONS

"U.S. Appl. No. 12/304,694, 312 Amendment filed Sep. 30, 2010", 7 pgs.

"U.S. Appl. No. 12/304,694, Notice of Allowance mailed Sep. 20, 2010", 10 pgs.

"U.S. Appl. No. 12/304,694, Preliminary Amendment filed Dec. 12, 2008", 3 pgs.

"U.S. Appl. No. 12/304,694, Response filed Aug. 20, 2010 to Restriction Requirement mailed Aug. 9, 2010", 6 pgs.

"U.S. Appl. No. 12/304,694, Restriction Requirement mailed Aug. 9, 2010", 6 pgs.

"U.S. Appl. No. 12/559,069 Notice of Allowance mailed Oct. 20, 2010", 7 pgs.

"U.S. Appl. No. 12/559,069 Restriction Requirement mailed Oct. 1, 2010", 2 pgs.

"International Application Serial No. PCT/US2007/072300, International Search Report and Written Opinion mailed Sep. 24, 2008", P220.

"U.S. Appl. No. 12/475,744 entitled "Asynchronous Pipelined Interconnect Architecture With Fan-out Support" filed Jun. 1, 2009".

Ekanayake, V. N, et al., "Asynchronous DRAM Design and Synthesis", Ninth IEEE International Symposium on Asynchronous Circuits and Systems (ASYNC'03), (2003), 174-183.

"U.S. Appl. No. 13/022,843 , Response filed Jul. 19, 2011 to Non Final Office Action mailed Apr. 20, 2011", 8 pgs.

"U.S. Appl. No. 13/022,843, Non Final Office Action mailed Apr. 20, 2011", 6 pgs.

"U.S. Appl. No. 13/022,843, Notice of Allowance mailed Aug. 12, 2011", 7 pgs.

"European Application Serial No. 07840303.7, Extended European Search Report mailed Aug. 16, 2010", 7 pgs.

"Korean Application Serial No. 10-2008-7031271, Office Action mailed Sep. 3, 2010", with Office Action Summary, 7 pgs.

"Korean Application Serial No. 10-2008-7031271, Response to Office Action Filed Apr. 11, 2011", with Brief Translation, 2 pgs.

"Korean Application Serial No. 10-2008-7031271, Response to Office Action mailed Nov. 3, 2010", With English Translation of Amended Claims, 41 pgs.

* cited by examiner

RECONFIGURABLE LOGIC FABRICS FOR INTEGRATED CIRCUITS AND SYSTEMS AND METHODS FOR CONFIGURING RECONFIGURABLE LOGIC FABRICS

CROSS REFERENCE TO RELATED APPLICATIONS

This application is a continuation of U.S. patent application Ser. No. 12/304,694, filed May 26, 2009, now issued as U.S. Pat. No. 7,880,499, which is a U.S. National Stage Filing under 35 U.S.C. 371 from International Application No. PCT/US2007/072300, filed Jun. 27, 2007 and published in English as WO 2008/008629 A2 on Jan. 17, 2008, which claims the benefit of priority under 35 U.S.C. 119(e) to provisional application Ser. No. 60/817,552 filed on Jun. 28, 2006, which applications and publication are incorporated herein by reference in their entireties.

FIELD OF THE INVENTION

The present invention relates to integrated circuits comprising reconfigurable logic fabrics and more specifically to a high performance reconfigurable logic fabric for deployment in integrated circuits including for example, field programmable gate arrays (FPGAs), application specific integrated circuits (ASICs) and other programmable logic devices where computational speed is a consideration in circuit design. The invention also relates to methods and apparatus for configuring high performance reconfigurable logic fabrics.

BACKGROUND OF THE INVENTION

Conventional reconfigurable logic fabrics rely on sequential arrangements of synchronous circuits embedded within the fabric. The presence of synchronous circuits arranged in sequence within the fabric limits the speed at which a logic fabric can perform logical operations. Each circuit in the sequence chain must wait at least one clock cycle to receive the results of the computation of the previous circuit in the chain. This delay limits the speed at which conventional reconfigurable logic fabrics can operate. The present inventors have recognized the need for reconfigurable logic fabrics capable of operating at faster speeds than can be obtained using conventional synchronous logic fabrics.

Configuring conventional reconfigurable logic fabrics to comprise specific hardware circuit implementations is accomplished using off-line electronic design automation (EDA) tools. These tools presume the presence of synchronous circuits in the reconfigurable fabric. The present inventors have recognized the need for a reconfigurable logic fabric that is not only capable of faster computational speeds, but is also amenable to design using available EDA design tools.

SUMMARY OF THE INVENTION

The invention provides reconfigurable logic fabrics and methods and systems for configuring reconfigurable logic fabrics.

DESCRIPTION OF THE DRAWING FIGURES

These and other objects, features and advantages of the invention will be apparent from a consideration of the following detailed description of the invention considered in conjunction with the drawing figures, in which.

DETAILED DESCRIPTION OF THE INVENTION

In accordance with the present invention there are provided herein asynchronous reconfigurable logic fabrics for integrated circuits and methods for designing asynchronous circuits to be implemented in the asynchronous reconfigurable logic fabrics.

FIG. 1

Figure 1:
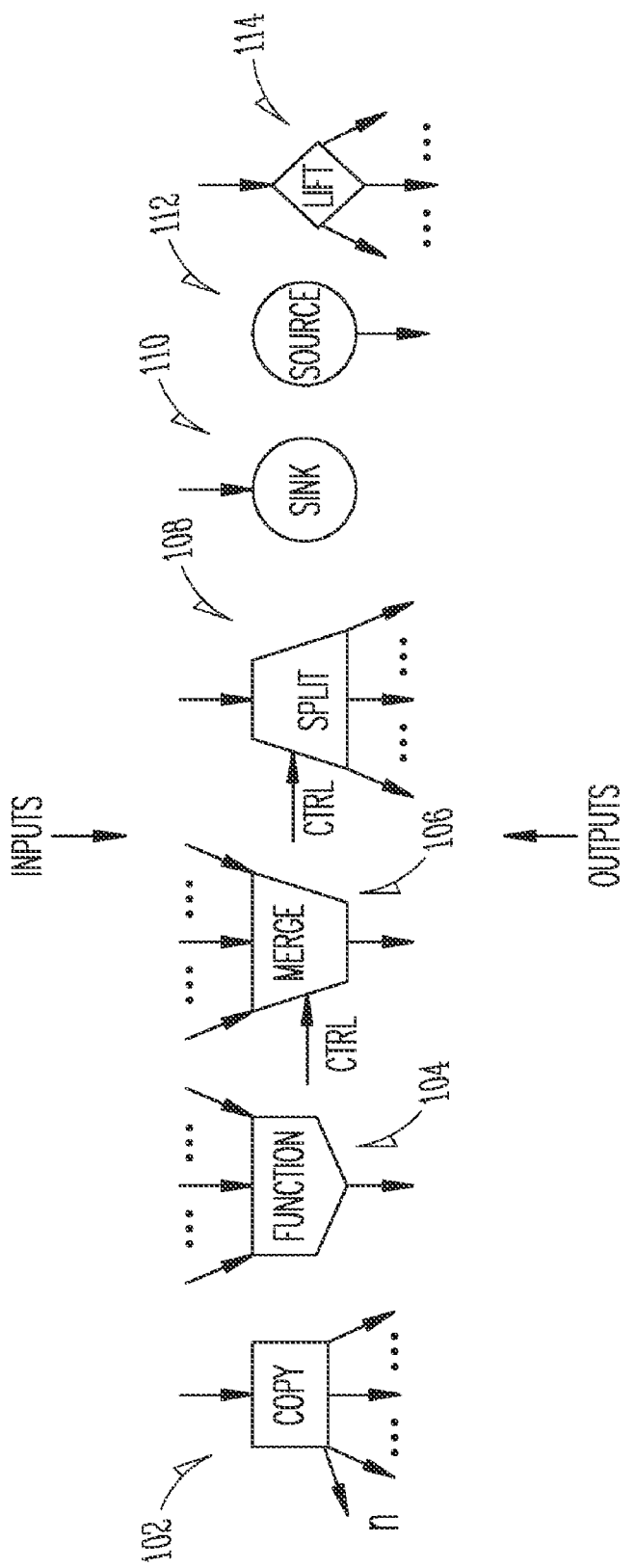
FIG. 1 is a conceptual diagram illustrating dataflow nodes suitable for representing asynchronous circuits operations to be implemented in a programmable logic fabric according to embodiments of the invention.

FIG. 1 illustrates example asynchronous dataflow operations 102-114. In one embodiment of the invention dataflow operations 102-114 define specific hardware implementations for an asynchronous reconfigurable logic fabric. Data for dataflow operations are represented as "tokens". Data tokens follow data paths. In FIG. 1 data paths are represented as edges.

For example, a copy operation 102 describes an operation whereby a node of a circuit duplicates a token at its token input and sends it to a plurality of receivers. A function 104 computes an arbitrary function of a plurality of input variables and provides the result at an output. According to embodiments of the invention a function does not complete until tokens arrive on all of its inputs.

A merge operation 106 is represented as a node comprising a plurality of inputs, a control input (ctrl), and a single output. The merge operation 106 reads a control token from the control input. The control token indicates the input from which the merge will read a token to provide on the output channel. A split 108 performs the opposite function of a merge. Split 108 has one input and a plurality of outputs. The value of the control token indicates the output to which the split will write the token read from the input channel.

A sink 110 consumes tokens unconditionally. A source 112 generates data tokens with a constant value. A source 112 does not produce a new token until its previous token is consumed. An initializer 114 begins with a data token on its input when a device, for example an FPGA, resets. After reset, initialize 114 behaves as a copy.

The operations described above as illustrated in FIG. 1 are used to describe hardware circuit implementations for specific configurations of a reconfigurable logic fabric according to an embodiment of the invention. Design tools implementing the basic operations illustrated in FIG. 1 can be used to configure the asynchronous reprogrammable logic fabric of the invention. The basic operations are combinable to implement circuits capable of performing more complex deterministic asynchronous computations using reconfigurable logic fabric of the invention.

The reconfigurable asynchronous logic fabric of the invention provides at least two benefits. First, the circuits comprising the fabric are capable of faster operation due to clock independent operation. Second, a representation of asynchronous circuits that will comprise fabrics of the invention is readily implemented using available design tools. Thus the embodiments of the invention optimize performance of circuits carrying out the dataflow operations described above.

FIG. 2

Figure 2:
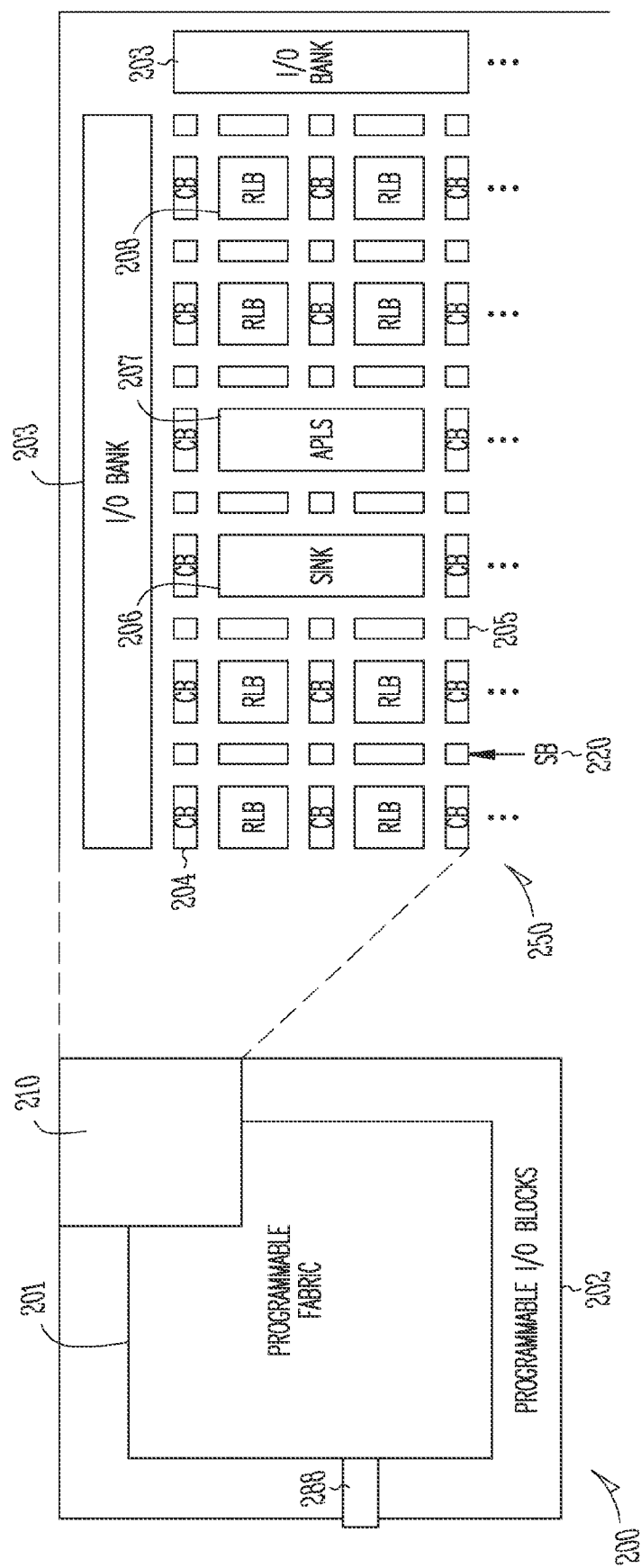
FIG. 2 illustrates a floor plan for a portion of a programmable logic fabric according to an embodiment of the invention.

FIG. 2 illustrates an integrated circuit 200 according to an embodiment of the invention. Integrated circuit 200 comprises programmable logic fabric 201 and programmable input output (I/O) blocks 202. Logic fabric 201 comprises at least one fabric portion 250. A fabric portion 250 comprises an array 210 of elements embedded within logic fabric 201. Elements of portion 250 comprise at least one of each of the flowing units (also referred to herein as blocks): Reconfigurable Logic Block (RLB) 208, Static Memory Block (SMB) 206 and Asynchronous Multiplier Block (AMB) 207.

In one embodiment of the invention each of the elements comprising logic fabric 201 of the invention is asynchronous, that is, capable of performing logic operations independent of a clock signal. Consequently, logic fabric 201 is capable of carrying out logical operations at higher speeds than can be achieved by conventional fabrics which rely on synchronous logic elements.

In one embodiment of the invention logic fabric 201 of the invention carries out logical operations at speeds comparable to clock speeds of at least 1 GHz. According to one embodiment of the invention a commercially available complementary metal-oxide semiconductor (CMOS) process is employed to embed elements within logic fabric 201. Programmable logic fabric 201, configured in accordance with embodiments of the invention described herein provides reprogrammable logic circuits for deployment in electronics equipment operating in high speed environments.

In one embodiment of the invention programmable logic fabric 201 provides a scalable fabric floor plan, i.e., architecture, comprising at least one array 210 of logic fabric elements. The programmable fabric 201 of the invention is deployable in a wide variety of semiconductor devices including, but not limited to, systems-on-chip (SoCs), application specific integrated circuits (ASICs), field programmable gate arrays (FPGAs), systems-in-a-package (SiPs), and application specific standard purpose (ASSP) devices.

Embodiments of fabric 201 are implementable by commercially available asynchronous logic families. Other embodiments of the invention are implemented using a combination of logic families. Examples of suitable logic families include quasi delay-insensitive circuits, self-timed circuits, speed independent circuits, bundled data circuits, micropipelines, asP, asP*, and GasP, as well as single track full buffer circuits, self-resetting/pulse-mode logic, or other circuits that use asynchronous techniques.

SRAM Memory Blocks (SMBs)

SMBs 206 are memory elements. According to one embodiment of the invention SMBs 206 comprise dual-port Static Random Access Memory (SRAM) modules. At least one SMB 206 is embedded in an array 210 of programmable logic fabric 201. An SMB 206 is accessible by RLBs 208 and AMBs 207. An SMB 206 is configurable to comprise at least one of a plurality of memory arrangements. Example memory arrangements for SMBs 206 include: 32K×1-bit; 16K×2-bit; 8K×4-bit; 4K×8-bit; 4K×9-bit; 2K×16-bit; 2K×18-bit; 1K×32-bit; 1K×36-bit; 512×64-bit; 512×72-bit.

The 9-, 18-, 36-, and 72-bit memory configurations of SMB 206 provide an extra bit for every byte of memory. According to some embodiments of the invention the extra bit is usable for parity checking. An SMB 206 is coupled to an interconnecting grid (not illustrated in FIG. 2) via a programmable interconnect element CB 204. An SMB 206 is also coupled to its neighboring elements, e.g., an AMB 207. According to one embodiment of the invention CB 204 provides an asynchronous interface for SMBs 206 to the interconnecting grid. In one embodiment of the invention CB 204 is asynchronous and pipelined. In asynchronous operation memory read/write requests are transmittable to SMB 206 before the previous read/write request has been satisfied by an SMB 206. In one embodiment of the invention SMB 206 is configurable to comprise an asynchronous First In First Out (FIFO) memory. In such an embodiment SMB 206 is configured as a circular buffer and includes logic to support insert and remove operations. In one embodiment of the invention the number of FIFOs embedded within logic fabric 201 and the number of ports to an SMB 206 is reprogrammable.

Asynchronous Multiplier Blocks (AMBs)

An AMB 207 comprises an asynchronous reconfigurable multiplier. AMB 207 is coupled to at least one SMB 206. Each SMB 206 has a neighboring AMB 207. A neighboring AMB 207 is configurable to perform signed multiplication at various widths. AMB 207 is programmable for a variety of multiplier configurations including, but not limited to: a single 72×72-bit multiplier; four 36×36-bit multipliers; eight 18×18-bit multipliers; sixteen 9×9-bit multipliers.

AMB 207 as described herein provides higher density and lower power consumption for integrated circuit 200 compared to multipliers constructed from RLBs. AMB 207 is configurable to write to and read from the interconnecting grid (not shown) by programming its associated interconnect element CB 204. An AMB 207 is also configured for communication directly with its adjacent SMB 206. This configuration of AMB and CB enables efficient programmable configuration of circuits, for example, multiply-accumulate circuits. In one embodiment of the invention multiply accumulate circuits are formed by configuring an RLB 208 as an accumulator and by configuring AMB 207 as a multiplier and employing an SMB 206 for storage. This arrangement of SMB, AMB and RLB is usable to implement a wide variety of digital signal processing (DSP) functions such as fast Fourier transform (FFT), finite impulse response (FIR) filters, and discrete cosine transform (DCT). Accordingly RLB of the invention are configurable to implement multipliers for applications demanding multiplication resources that would be inefficient to provide by an AMB 207 alone.

Channel Boxes (CB) 220 and Switch Boxes (SB 205)

Logic fabric 201 comprises a plurality of channel boxes (CB) 220 and a plurality of switch boxes (SB) 205. Each RLB 208, SMB 206 and AMB 207 is coupled to a corresponding portion of an interconnecting grid of fabric 201 via a corresponding channel box CB 220. Switch boxes (SB) 205 are provided at intersecting portions of the pipelined interconnecting grid. SB 205 is programmable to couple elements of fabric 201 across interconnecting grid portions. Configuration of array 210 is accomplished by coupling fabric elements to the interconnecting grid by programming of channel boxes 206 and switch boxes 205 to execute dataflow operations such as those described with respect to FIG. 1 such that reprogrammable logic fabric 201 comprises an asynchronous reconfigurable logic fabric.

Reconfigurable Logic Blocks (RLB) 208

In one embodiment of the invention reprogrammable logic blocks (RLBs) 208 comprise logic circuits. Logic circuits carry out logical operations on signals provided at logic circuit inputs to provide an operation result at a logic circuit output.

In one embodiment of the invention each RLB of logic fabric 201 comprises only asynchronous logic circuits. Thus, the invention is a departure from conventional logic circuits and fabrics. Conventional programmable logic fabrics comprise synchronous circuits through the fabric. Thus, conventional fabrics require a clock to synchronize computation operations. In contrast, fabric 201 of the invention does not rely on a clock to synchronize computation operations. Because RLBs 208 comprise asynchronous logic circuits, fabric 201 does not require a clock distribution network.

In one embodiment of the invention an RLB 208 comprises an arrangement of logic clusters LCs 400.

Logic Cluster 400

Figure 4:
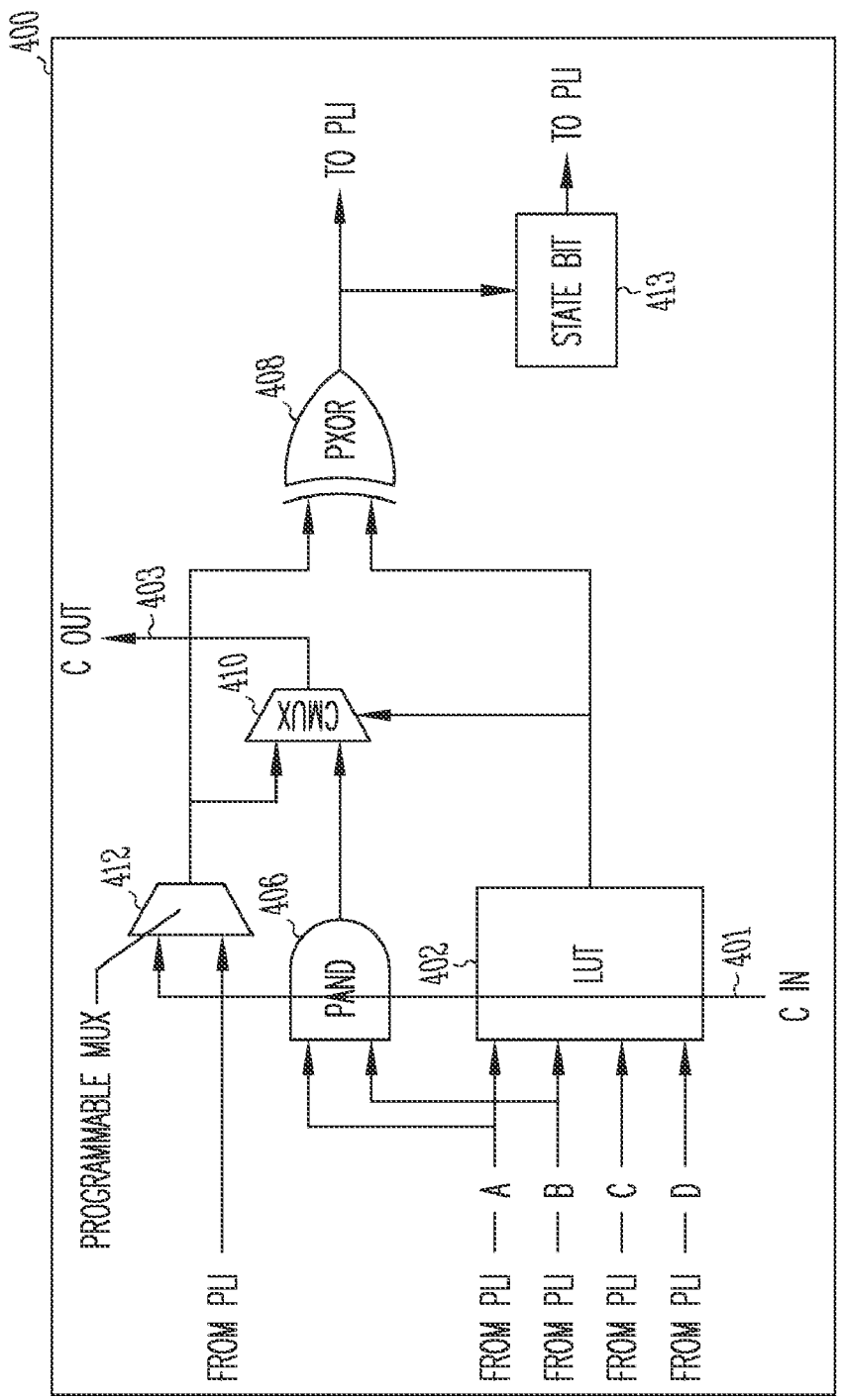
FIG. 4 is a circuit diagram of a logic cluster pair according to an embodiment of the invention.

FIG. 4 illustrates a logic cluster (LC) 400 according to an embodiment of the invention. In one embodiment of the invention each RLB comprises a group of four LC 400. (Example illustrated in FIG. 5.) Each LC 400 is programmable to operate in sequence such that RLB 208 is configurable to carry out complex logic operations on signals provided across a plurality of LC inputs. LC 400 inputs are indicated at A, B, C and D in FIG. 4.

FIG. 4 is schematic of a Logic Cluster 400. Unlike traditional reconfigurable logic circuits, LC unit 400 comprises asynchronous logic circuits. In one embodiment of the invention the asynchronous logic circuits are pipelined. LC unit 400 comprises a four-input lookup table (LUT) 402, a programmable AND (PAND) 406 an XOR gate (PXOR) 408, and a carry-chain mux (CMUX) 410 and a programmable multiplexer (PMUX) 412. LUT 402 implements functions comprising up to four inputs. To implement functions with less than four inputs, the sources in the RLB are used to generate tokens for the unused inputs. The output of the LUT 402 is coupled through a programmable XOR buffer (PXOR) 408 to the output of LC 400 or to its corresponding state bit 413. An embodiment of the invention PXOR 408 is programmable to act as a buffer. Alternatively PXOR 408 is programmable to perform an XOR operation between the output of the LUT 402 and a carry-in value provided at Cin 401.

Each LC unit 400 comprises circuitry for dedicated early-out carry chains, which can be used with the PXOR 408 to efficiently implement ripple-carry adders. The carry mux (CMUX) 410 is programmable to use the output of LUT 402 resulting from an operation implemented by LUT 402 and a carry-in token 401 to determine the correct carry-out token 403. If the carry-in token 401 is not required for determining the carry-out token 403 (for example, if the values of both inputs to a one-bit adder are zero, the carry out will be zero). In that case CMUX 410 generates a carry-out token at 403 before the carry-in token arrives at 401. Each LC unit 400 can therefore be configured as two bits of a full adder, with the carry chain going from bottom to top. The carry-chain circuitry also contains the programmable AND unit (PAND), which can be used for implementing multipliers.

Logic Cluster Pair 300

Figure 3:
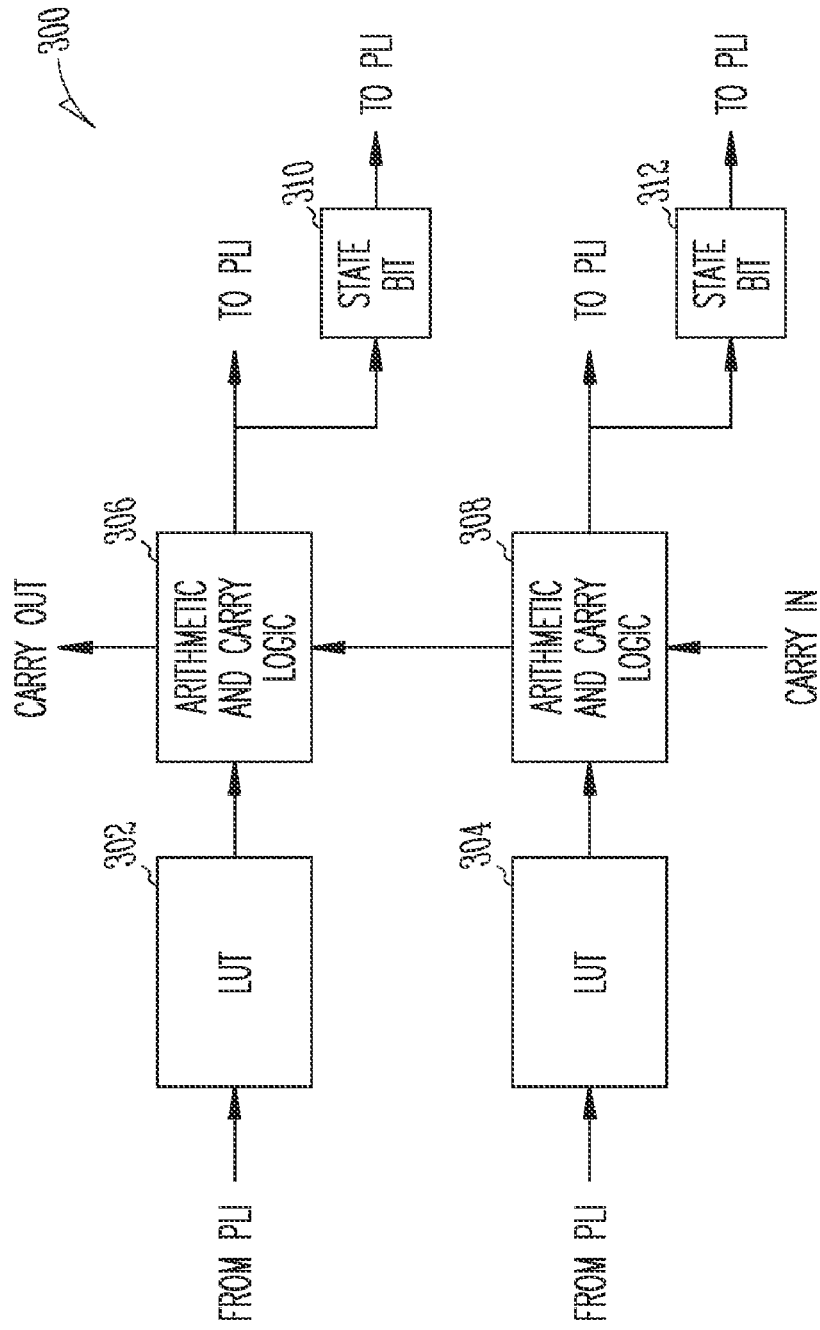
FIG. 3 is a block diagram of a logic cluster according to an embodiment of the invention.

FIG. 3 illustrates a logic cluster pair 300. Logic cluster pair 300 comprises two 4-input Look Up Tables (LUT) 302, 304, arithmetic and carry logic 306, 308, and state bit storage elements 310, 312. The output of each LUT 302,304 is configurable to drive the corresponding output of a LC and a corresponding state bit. In one embodiment of the invention the output of a LUT 302 is selectable to drive the corresponding output of the LC or the state bit. A PLI (best illustrated in FIG. 7) is configurable such that the output of a state bit (indicated at 310 and 312) is an input to an LUT 302, 304). This configuration enables state-holding computations.

According to one embodiment of the invention arithmetic and carry logic 306 and 308 are configured to provide early-out carry chains. In this configuration an RLB is capable of generating a result of a logic operation as soon as the output can be determined. The RLB generates the result without waiting for all the inputs to be ready. By concatenating arithmetic and carry logic blocks 306 and 308 in the manner shown in FIG. 3, the average latency of the block is reduced. In one embodiment of the invention the blocks including the LUT, arithmetic and carry logic, and state bit are all pipelined and implemented with asynchronous logic.

In addition to logic clusters, RLBs 208 according to embodiments of the invention further comprise token sources and sinks, two way conditional units, four way conditional units, and eight way conditional units. RLBs configured in accordance with embodiments of the invention allow efficient mapping of logic operations to architecture of fabric 201. Each RLB sends and receives data tokens to and from the pipelined interconnect by using its adjacent CBs, as shown in FIG. 2.

Programmable I/O Blocks 202

Programmable I/O blocks 202 (illustrated in FIG. 2) are configurable to enable logic fabric 201, and thus integrated circuit 200 to be coupled for operation in synchronous circuits, devices and systems. In one embodiment of the invention programmable I/O blocks 202 are arranged around the perimeter of logic fabric 201, for example to form a perimeter portion of integrated circuit 200. In one embodiment of the invention I/O blocks comprise programmable synchronous I/O blocks and static synchronous and asynchronous I/O blocks.

One example embodiment of the invention comprises an FPGA implemented using two types of I/Os. In one embodiment of the invention the types are selectable. The first type comprises synchronous I/O banks (SIOs), which comprise a combination of standard synchronous I/O blocks as well as configurable synchronous blocks [e.g. FIG. 2 at 288] that can convert from the asynchronous fabric to a synchronous interface. Converter unit 288 includes an input coupled to outputs of the asynchronous elements of logic fabric 201 to receive logic operation results. The converter unit 288 provides the operation results synchronously at a converter output. The second type comprises asynchronous I/O banks (AIOs), which can be used for asynchronous and high-speed communication between a plurality of FPGAs.

According to some embodiments of the invention programmable I/O blocks are configured in accordance with a technical standard that specifies electrical input output unit characteristics. Examples electrical standards with which embodiments of I/O blocks of the invention conform include, but are not limited to GPIO, PCI, PCI-X, LVDS, LDT, SSTL, and HSTL. Accordingly signals coupled through I/O blocks will comprise a variety of voltages and drive strengths depending on the specific application in which the invention described herein is implemented.

Synchronous I/O (SIO) Banks

According to embodiments of the invention integrated circuit 200 includes I/O banks 202. I/O banks 202 enable asynchronous fabric 210 to interface with synchronous logic circuits. In one embodiment of the invention I/O banks 202 are arranged about the perimeter of programmable logic fabric 201. I/O banks 202 provide high-throughput communication between two asynchronous ICs 200, for example two FPGAs. According to embodiments of the invention such communication is accomplished without the drawback of synchronous conversion. I/O banks 202 are configurable for two types of asynchronous communication. The first type is a standard asynchronous handshake protocol using a bundled-data interface. The second type is a high-speed serial link enabling, for example, FPGA-to-FPGA communication.

The bundled-data interface uses a set of I/O pins for data, plus a pair of request/acknowledge pins to implement a standard bundled data asynchronous handshake protocol. I/O banks 203 are configurable to implement at least one of a four-phase handshake and a transition-signaling two-phase protocol. I/O band 203 is configurable to implement sender initiated and receiver initiated protocols. The protocol is implementable using a selectable number of I/O pins up to a limit comprising the number of portions of I/O block 202 comprising asynchronous I/O banks. The physical signaling for the protocol is selectable by a programmable signaling block.

A serial link protocol that allows multi-Gbps throughput for high-speed FPGA-to-FPGA communication is also implementable using I/O blocks 202. This serial link provides high-bandwidth and low latency asynchronous communication without any re-synchronization overhead.

In one embodiment of the invention asynchronous to synchronous conversion is effected by Electronic Design Automation (EDA) tools. EDA tools are usable to define an I/O as providing a synchronous output during design of IC 200. EDA tools provide converters comprising programmable clock generators.

According to embodiments of the invention EDA converters are used to specify the frequency of the programmable I/O blocks 202. Fabric 201 of the invention permits use of EDA converters. Reconfigurable fabric 201 is configurable for operation at frequencies specified by the clock generator of the EDA tool. Thus the invention enables use of EDA tools and consequently, the use of synchronous-to-asynchronous converters provided by EDA tools. The use of EDA converters also provides a delay-locked loop to enable a synchronous output of IC 200 to be valid at a fixed delay offset from a clock edge.

EDA tools provide a second class of converters that enable synchronous output with a valid bit for IC 200. In that case an operation result is produced whenever fabric 201 generates a new data output. The physical signaling for a protocol is selectable from a programmable signaling block according to some embodiments of the invention.

The asynchronous architecture of fabric 201 supports synchronous troubleshooting integrated circuit 200. In one embodiment of the invention IC 200 comprises asynchronous to synchronous converters 288 that can be activated in a user-specified manner. Key registers or wires are specified as "debug" signals. These will automatically be connected to on-chip debug registers of IC 200. A debug register can be scanned and loaded, with the clock used to step through the execution in a sequential manner similar to a synchronous flow. An entire set of debug registers and I/Os can be scanned or loaded via the Joint Test Action Group (JTAG) interface. As is known in the art, JTAG refers to the IEEE 1149.1 standard, Standard Test Access Port and Boundary-Scan Architecture for test access ports used for testing printed circuit boards using boundary scan.

Figure 5:
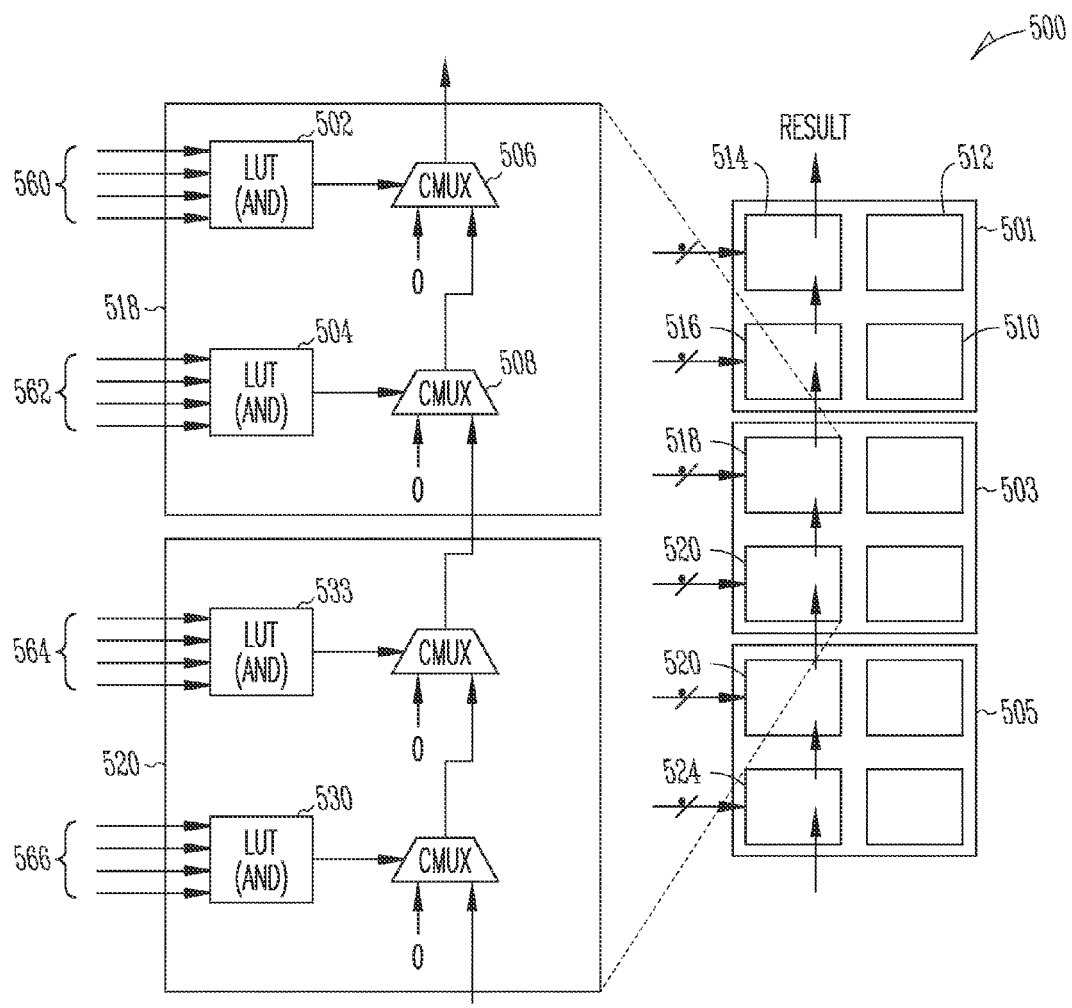
FIG. 5 is a circuit diagram illustrating logic clusters including an arrangement of reconfigurable logic blocks implementing a wide AND operation according to an embodiment of the invention.

FIG. 5 Reconfigurable Logic Blocks (AND Configuration)

FIG. 5 is a circuit diagram illustrating logic clusters such as those illustrated in FIGS. 3 and 4 arranged to comprise reconfigurable logic blocks (RLBs) 501,503 and 505 according to a simplified example of an embodiment of the invention. In the embodiment illustrated in FIG. 5 RLBs 501,503 and 505 are configured to implement a wide AND operation. Each RLB comprises circuit elements providing wide AND, OR, and sum-of-products (SOP) operations. Wide AND operations that span multiple RLBs are formed by programming LUTs (e.g., 502, 504) to perform 4-input AND operations and by using the carry chains. FIG. 5 shows a 48-input AND that spans RLBs 501,503 and 505. In one embodiment of the invention the AND is pipelined. In other words the bottommost LUT 530 accepts new inputs as soon as LUT 530 produces its output. LUT 530 need not wait for the entire 48-input AND to complete.

With reference particularly to FIG. 5, each of six logic clusters (LC) 514, 516, 518, 520 and 522 includes two four-input LUTs (e.g., LUT 502 and 504 of LC 518) performing an AND function on the inputs and feeding the output to a chain of CMUXs (e.g. CMUS 508 and 506 of LC 518). The 64 input lines are formed in groups of sixteen each (e.g., inputs to LUT 502,504,533 and 530 of LCs 518 and 520 of RLB 503). As described above, each of the LCs comprises two LUTs and the connecting arithmetic logic (AL) as described above.

Figure 6:
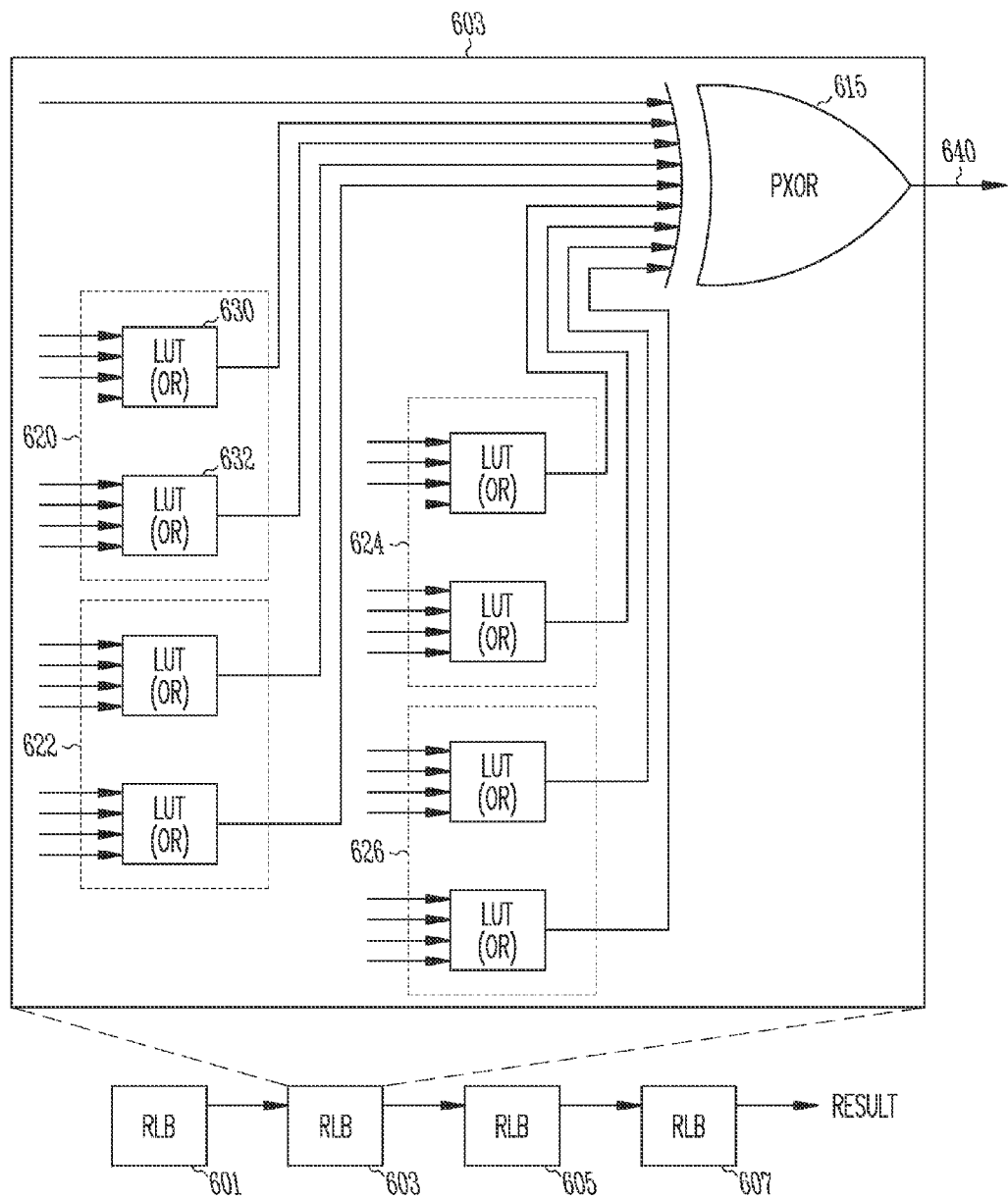
FIG. 6 is a circuit diagram illustrating an arrangement of reconfigurable logic blocks implementing wide OR operations according to an embodiment of the invention.

FIG. 6 Reconfigurable Logic Blocks (OR Configuration)

FIG. 6 is a circuit diagram illustrating an arrangement of reconfigurable logic blocks implementing wide OR operations according to an embodiment of the invention. In contrast to the wide AND operations, which flow vertically using the dedicated carry connections between adjacent RLBs, wide OR operations flow horizontally through dedicated horizontal connections. Each RLB contains a programmable OR buffer (POR) that can have up to nine inputs: the outputs of each of the LCs, and the output of the POR from the left-adjacent RLB via a dedicated horizontal connection. This enables a single RLB to perform a 32-input OR. FIG. 6 shows four RLBs 602A, 602B, 602C, 602D arranged to form a 128-input OR 600. One exemplary RLB 602B is expanded to show the inclusion of eight four-input LUTs each programmed to perform an OR function with the outputs combined into an eight-input plus carry POR.

By combining the techniques used to create wide AND and OR operations, a user can efficiently implement very wide sum-of-product (SOP) operations. The programmable OR circuit is pipelined, and the POR can generate its output before all its inputs are ready. For example, if one of the input tokens is "1" then the output of the POR is known even though all the other inputs are not ready as yet. The POR produces an early-out "1" value that allows the rest of the circuit to proceed even though all the inputs may not be ready. Alternative designs can vary the number of inputs supported by the POR.

FIG. 7

Figure 7:
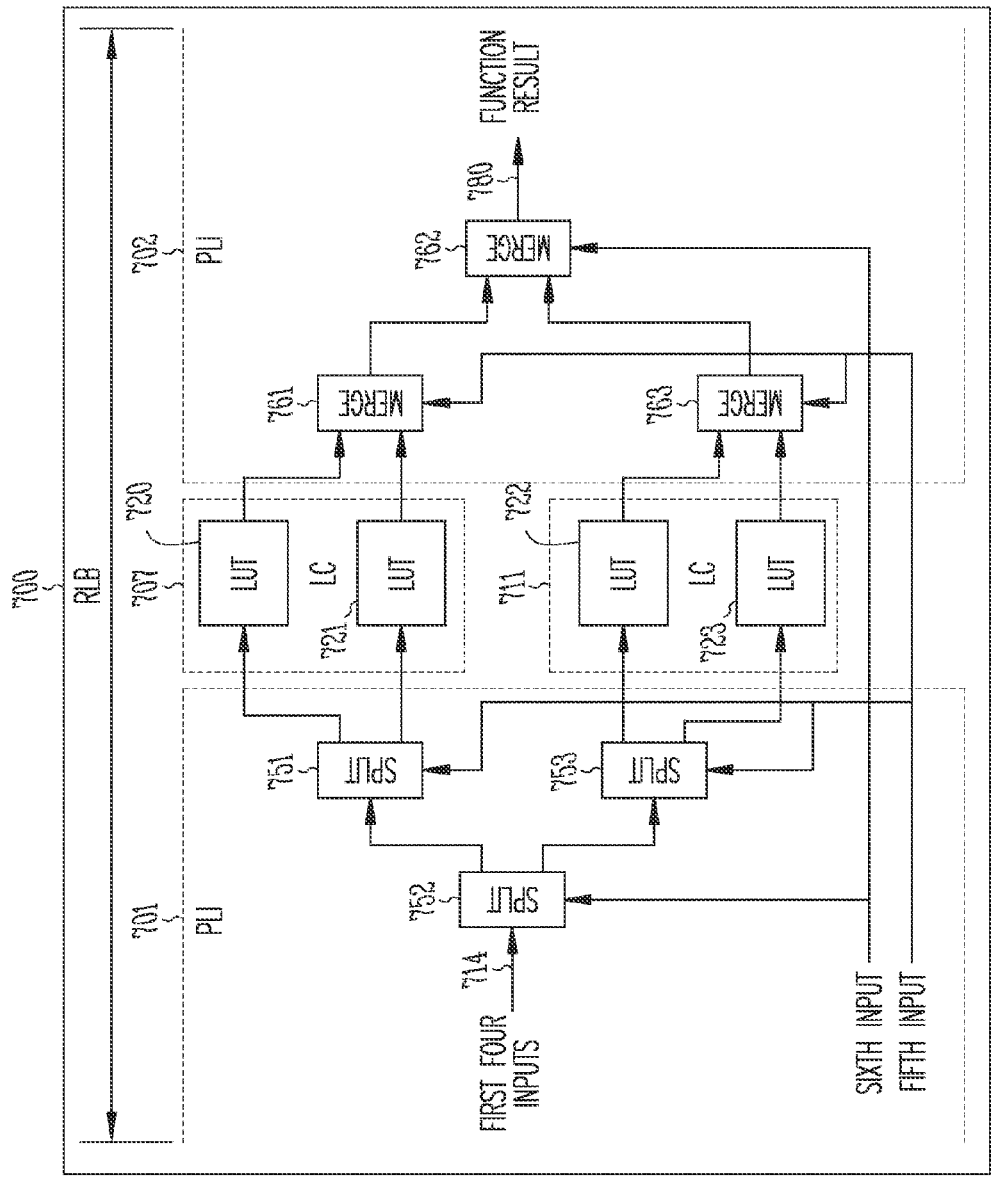
FIG. 7 is a circuit diagram illustrating a reconfigurable logic block according to an embodiment of the invention.

FIG. 7 is a circuit diagram illustrating a reconfigurable logic block (RLB) 700 according to an embodiment of the invention. RLB 700 comprises first and second programmable logic interfaces (PLI) 701 and 702 respectively, and first and second logic clusters (LC) 707 and 711 respectively. Each PLI 701 and 702 comprises a plurality of programmable switches [CBs and SBs?] that are configurable to couple components of RLB 700 to components of other RLBs (not shown in FIG. 7). First and second PLI 701 and 702 further comprise input and output buffers configured to communicate with CBs corresponding to RLB's on the interconnecting grid (not shown). In one embodiment of the invention the input buffers are provided by initializing tokens on reset.

According to various embodiments of the invention the output buffers are configurable to perform copying operations. This enables a single output token to be copied to multiple CBs.

First and second PLIs 701 and 702 of RLB 700 comprise circuits configured by implement split operations indicated at 751,752 and 753 and merge operations indicated at 761,762 and 763. These operations are usable to implement 5-, 6- or 7-input functions for logic clusters 707 and 711. FIG. 7 shows an RLB 700 configured as a 6-input function. In one embodiment of the invention the splits and merges are connected to the LUTs 721, 722, 723 and 724. In that manner RLB 700 is configured to perform logic operations on the first through sixth inputs of LUTs and to provide the result of the logic operations at RLB output 780.

Each RLB 700 includes a plurality of sources and sinks. The sources create data tokens that go to and from PLI 701 and 702. These can be used as inputs for the LCs (as LUT inputs or as carry-in values).

Figure 8:
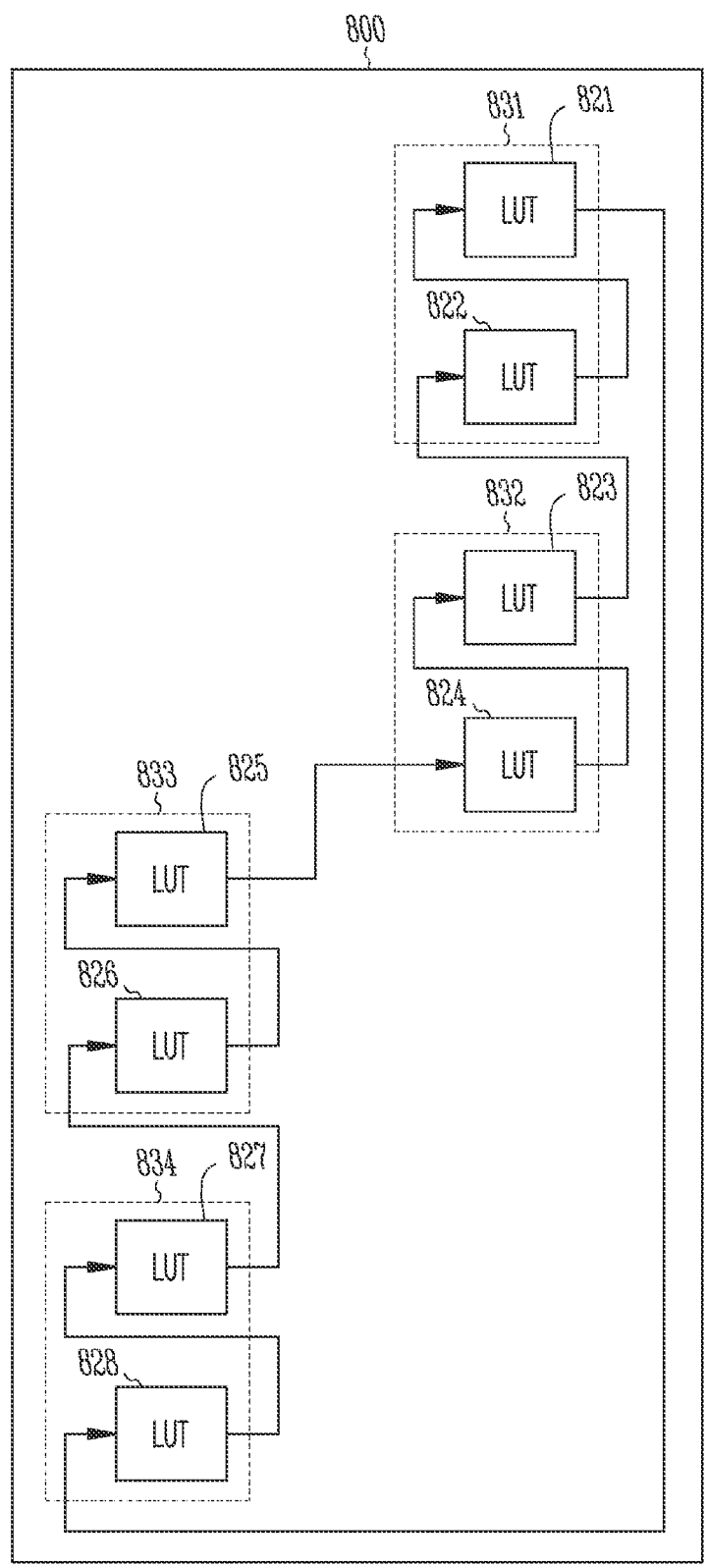
FIG. 8 is a circuit diagram illustrating a lookup tables configured in a loop in accordance with an embodiment of the invention.

FIG. 8 Low Latency Loops

FIG. 8 illustrates a circuit 800 comprising logic clusters 831-834. LUTs 821-828 are arranged to implement a loop in accordance with an embodiment of the invention.

Figure 9C:
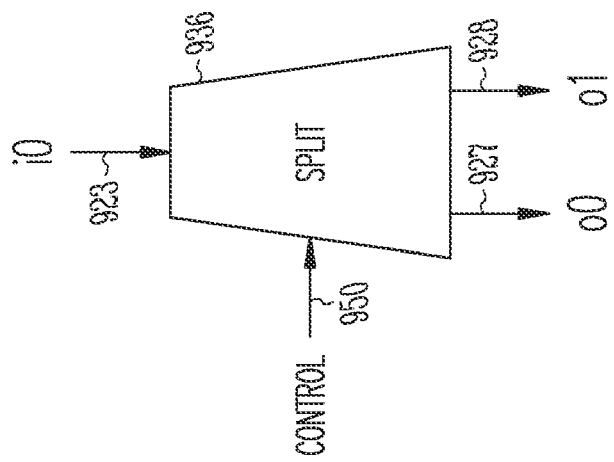
FIG. 9C is a logic diagram illustrating a logic element of the invention configured to carry out a split operation.
Figure 9B:
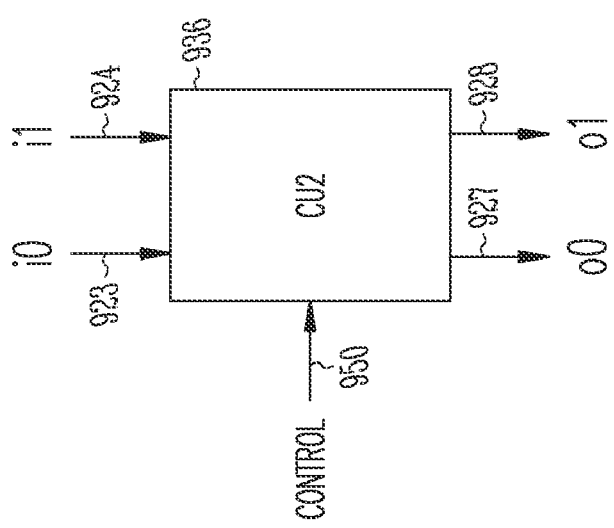
FIG. 9B is a logic diagram representing a logic element capable of reconfiguration to carry out logic operations illustrated in FIGS. 9A and 9C.
Figure 9A:
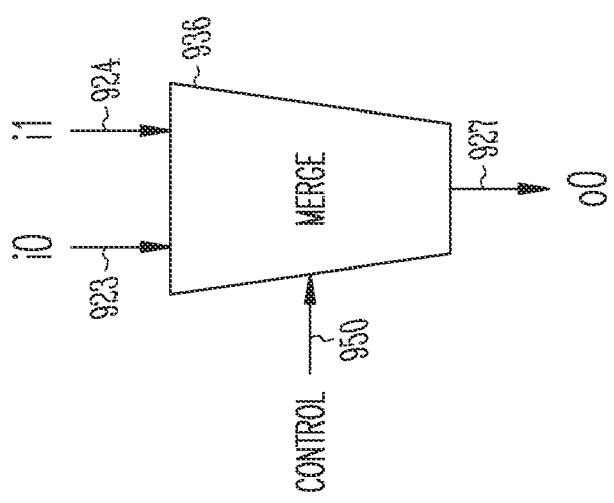
FIG. 9A is a logic diagram illustrating a logic element of the invention configured to carry out a merge operation.

FIGS. 9A, 9B and 9C

FIG. 9B is a conceptual diagram illustrating an element of the fabric of the invention configured as a conditional unit (CU) according to an embodiment of the invention. Each RLB 700 (illustrated in FIG. 7) is configurable as a conditional unit (CU) as illustrated in FIG. 9A at 936. In one embodiment of the invention RLB 700 comprises two 2-way conditional units CU2, one 4-way and one 8-way conditional unit (CU2, CU4, and CU8). CU 936 is illustrated in two configurations as illustrated in FIGS. 9A and 9C. The configuration of CU 936 is determined by control signal 950. In a merge operation CU 936 merges inputs i0 and i1 to provide a merged output o0. In a split operation CU 936 splits an input i0 into two outputs o0 and o1.

FIG. 9C illustrates CU 936 configured to perform a split operation. CU 936 reads a data token from its first input 923 and a control token from its control channel 950. Based on the value of the control token 950, CU 936 sends the data token on one of its outputs 927, 928.

FIG. 9A illustrates CU 936 configured to perform a merge operation. When CU 936 is configure to perform a merge operation, CU 936 reads a control token from 950 and, based on the value of that token, reads a data token from one of its inputs 923,924 and sends that token on its first output 927.

A third configuration for a condition unit is as a deterministic MUX, which corresponds to a merge block that always receives tokens on all its inputs but only selects one of them for output. An alternative way to configure large input functions using an RLB is to not use a split and merge tree as shown in FIG. 7, but to copy the inputs (rather than using a split) and then use a deterministic MUX instead of a merge.

While the invention has been shown and described with respect to particular embodiments, it is not thus limited. Numerous modifications, changes and enhancements will now be apparent to the reader.

What is claimed is:

1. An apparatus, comprising: an asynchronous static memory block configured to operate as a first-in, first-out (FIFO) storage device;
an asynchronous input reconfigurable logic block coupled to at least one input of the asynchronous static memory block, and an asynchronous output reconfigurable logic block coupled to at least one output of the asynchronous static memory block;
and a pair of synchronous input/output (I/O) blocks, a first one of the pair having an asynchronous output coupled to an input of the asynchronous input reconfigurable logic block, and a second one of the pair having an asynchronous input coupled to an output of the asynchronous output reconfigurable logic block.

2. The apparatus of claim 1, wherein the asynchronous static memory block, the asynchronous input reconfigurable logic block, and the asynchronous output reconfigurable logic block form part of a reconfigurable logic fabric.

3. The apparatus of claim 2, wherein the pair of synchronous I/O blocks form part of a plurality of synchronous I/O blocks arranged around a perimeter of the reconfigurable logic fabric.

4. The apparatus of claim 2, wherein the logic fabric forms a part of an integrated circuit.

5. The apparatus of claim 1, wherein the at least one input of the asynchronous static memory block and the at least one output of the asynchronous static memory block comprise a portion of a programmable number of static memory block input ports and static memory block output ports, respectively.

6. The apparatus of claim 1, wherein the asynchronous static memory block is configured to operate, at least in part, as a circular buffer with logic to support insert and remove operations.

7. The apparatus of claim 1, further comprising: an asynchronous multiplier coupled to the static memory block.

8. The apparatus of claim 7, wherein the asynchronous multiplier comprises a programmable multiplier unit.

9. The apparatus of claim 1, wherein at least one of the pair of synchronous I/O blocks comprises a configurable synchronous I/O block.

10. The apparatus of claim 1, wherein at least one of the pair of synchronous I/O blocks comprises a bundled-data interface to implement an asynchronous handshake protocol.

11. The apparatus of claim 1, wherein at least one of the pair of synchronous I/O blocks comprises a serial link to implement asynchronous communication.

12. The apparatus of claim 1, wherein each of the pair of synchronous I/O blocks comprises: a converter unit to enable at least one of synchronous to asynchronous signal conversion, or asynchronous to synchronous signal conversion.

13. The apparatus of claim 1, wherein at least one of the asynchronous input reconfigurable logic block or the asynchronous output reconfigurable logic block comprise circuit elements to enable at least one of wide AND, wide OR, or sum-of-products (SOP) operations.

14. The apparatus of claim 1, wherein at least one of the asynchronous input reconfigurable logic block or the asynchronous output reconfigurable logic block comprise programmable logic interfaces.

15. The apparatus of claim 14, wherein at least one of the programmable logic interfaces comprises switches to couple the at least one of the asynchronous input reconfigurable logic block or the asynchronous output reconfigurable logic block to another asynchronous reconfigurable logic block.

16. The apparatus of claim 14, wherein at least one of the programmable logic interfaces comprises input or output buffers configured to communicate with asynchronous, programmable interconnect elements.

17. The apparatus of claim 1, wherein at least one of the asynchronous input reconfigurable logic block or the asynchronous output reconfigurable logic block is configured as a conditional unit.

18. A method, comprising:
synchronously communicating information with at least one of a pair of synchronous input/output (I/O) blocks, a first one of the pair coupled to an input of an asynchronous input reconfigurable logic block, and a second one of the pair coupled to an output of an output asynchronous reconfigurable logic block;

and asynchronously accessing a first-in, first-out (FIFO) memory to store the information in an asynchronous static memory block, wherein the asynchronous input reconfigurable logic block is coupled to at least one input of the asynchronous static memory block, and wherein the asynchronous output reconfigurable logic block is coupled to at least one output of the asynchronous static memory block.

19. The method of claim 18, further comprising: operating at least a portion of the asynchronous static memory block as a circular buffer.

20. The method of claim 18, further comprising: operating the asynchronous static memory block, at least one of the asynchronous input reconfigurable logic block or the asynchronous output reconfigurable logic block, and an asynchronous multiplier to implement at least one of a fast Fourier transform (FFT), a finite impulse response (FIR) filter, or a discrete cosine transform (DCT).

* * * * *